United States Patent
Johanson et al.

(10) Patent No.: US 10,103,012 B2
(45) Date of Patent: Oct. 16, 2018

(54) ONE-PIECE PROCESS KIT SHIELD FOR REDUCING THE IMPACT OF AN ELECTRIC FIELD NEAR THE SUBSTRATE

(71) Applicant: APPLIED MATERIALS, INC., Santa Clara, CA (US)

(72) Inventors: William Johanson, Gilroy, CA (US); Kirankumar Savandaiah, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 33 days.

(21) Appl. No.: 15/260,190

(22) Filed: Sep. 8, 2016

(65) Prior Publication Data

US 2017/0076924 A1 Mar. 16, 2017

(30) Foreign Application Priority Data

Sep. 11, 2015 (IN) .......................... 2866/DEL/2015

(51) Int. Cl.
*H01J 37/34* (2006.01)
*H01J 37/32* (2006.01)
(Continued)

(52) U.S. Cl.
CPC .......... *H01J 37/3441* (2013.01); *C23C 14/34* (2013.01); *C23C 14/564* (2013.01);
(Continued)

(58) Field of Classification Search
CPC ......... C23C 14/34; C23C 14/35; C23C 14/54; C23C 14/564; H01J 37/32513;
(Continued)

(56) References Cited

U.S. PATENT DOCUMENTS 5,658,442 A * 8/1997 Van Gogh ........... C23C 14/3407
204/192.12
6,837,974 B2 1/2005 Lawson et al.
(Continued)

FOREIGN PATENT DOCUMENTS

JP 2009-127090 * 6/2009

OTHER PUBLICATIONS

Machine Translation JP 2009-127090. (Year: 2009).*
(Continued)

*Primary Examiner* — Rodney G McDonald
(74) *Attorney, Agent, or Firm* — Moser Taboada; Alan Taboada

(57) ABSTRACT

Embodiments of process kit shields and process chambers incorporating same are provided herein. In some embodiments, a one-piece process kit shield configured for use in a processing chamber for processing a substrate having a given diameter includes: a cylindrical body having an upper portion and a lower portion; an annular heat transfer channel disposed within the upper portion; and a cover ring section extending radially inward from the lower portion and having an annular leg extending from a bottom surface of the cover ring section, wherein the annular leg is configured to interface with a deposition ring to form a tortuous path between the bottom surface and the deposition ring.

20 Claims, 3 Drawing Sheets

(51) Int. Cl.
    *C23C 14/34*   (2006.01)
    *C23C 14/56*   (2006.01)
(52) U.S. Cl.
    CPC .. *H01J 37/32513* (2013.01); *H01J 37/32642* (2013.01); *H01J 37/32651* (2013.01); *H01J 37/3405* (2013.01)
(58) Field of Classification Search
    CPC ........... H01J 37/32642; H01J 37/32651; H01J 37/3405; H01J 37/3441; H01J 2237/026
    USPC ........................................ 204/298.11, 298.09
    See application file for complete search history.

(56) References Cited

U.S. PATENT DOCUMENTS

| | | | |
|---|---|---|---|
| 7,981,262 | B2 | 7/2011 | Pavloff et al. |
| 8,221,602 | B2* | 7/2012 | Brown ................. C23C 14/564 118/728 |
| 2003/0146084 | A1 | 8/2003 | Fu |
| 2007/0095654 | A1 | 5/2007 | Gopalraja |
| 2007/0102286 | A1 | 5/2007 | Scheible et al. |
| 2007/0209931 | A1 | 9/2007 | Miller |
| 2008/0006523 | A1 | 1/2008 | Hosokawa et al. |
| 2008/0078326 | A1 | 4/2008 | Sung et al. |
| 2008/0141942 | A1 | 6/2008 | Brown et al. |
| 2011/0303960 | A1 | 12/2011 | Cao et al. |
| 2013/0277203 | A1 | 10/2013 | Rasheed et al. |
| 2014/0027275 | A1* | 1/2014 | Kao ................. H01J 37/32522 204/298.09 |
| 2014/0174910 | A1 | 6/2014 | Dedontney |
| 2014/0190822 | A1 | 7/2014 | Riker et al. |
| 2015/0114567 | A1 | 4/2015 | Nagayama et al. |
| 2016/0189938 | A1 | 6/2016 | Savandaiah et al. |

OTHER PUBLICATIONS

U.S. Appl. No. 15/201,019, filed Jul. 1, 2016, Johanson et al.
U.S. Appl. No. 15/287,675, filed Oct. 8, 2016, Johanson et al.
International Search Report and Written Opinion dated Mar. 29, 2016 for PCT Application No. PCT/US2015/064454.
International Search Report and Written Opinion dated Oct. 21, 2016 for PCT Application No. PCT/US2016/040847.
International Search Report and Written Opinion dated Dec. 15, 2016 for PCT Application No. PCT/US2016/061015.

* cited by examiner

ONE-PIECE PROCESS KIT SHIELD FOR REDUCING THE IMPACT OF AN ELECTRIC FIELD NEAR THE SUBSTRATE

CROSS-REFERENCE TO RELATED APPLICATIONS

This application claims benefit of Indian patent application number 2866/DEL/2015, filed Sep. 11, 2015 which is herein incorporated by reference in its entirety.

FIELD

Embodiments of the present disclosure generally relate to substrate processing equipment.

BACKGROUND

Physical Vapor Deposition (PVD) chambers deposit films on all components surrounding the plasma. Over time, the deposited layer can shed particles that contaminate the substrate being processed. When the process kit undergoes thermal cycling from plasma heating and subsequent cooling while the plasma is off, the deposited film experiences thermal stress that results from the mismatch in the coefficient of thermal expansion (CTE) between the film and the underlying component material. When the stress exceeds the limits of adhesion, particles flake off of the process kit and land on the substrate.

High temperature aluminum PVD chambers can generate aluminum whiskers on the substrate. These whiskers are formed when the process kit surrounding the substrate does not have sufficient time to cool down between subsequent processes. The deposition process heats the substrate significantly more than the heated pedestal. Because the substrate is electrostatically chucked to the pedestal, the wafer is not free to bow under the thermal stress caused by the CTE mismatch between the thick aluminum film and the substrate (e.g., silicon). When the film stress on the substrate gets high enough, whiskers pop out, thus reducing the film stress. The inventors have observed that the temperature of the cover ring and shield play an important role in cooling the substrate via thermal radiation, and in minimizing whisker formation.

Therefore, the inventors have provided an improved process kit.

SUMMARY

Embodiments of process kit shields and process chambers incorporating same are provided herein. In some embodiments, a one-piece process kit shield configured for use in a processing chamber for processing a substrate having a given diameter includes: a cylindrical body having an upper portion and a lower portion; an annular heat transfer channel disposed within the upper portion; and a cover ring section extending radially inward from the lower portion and having an annular leg extending from a bottom surface of the cover ring section, wherein the annular leg is configured to interface with a deposition ring to form a tortuous path between the bottom surface and the deposition ring.

In some embodiments, a process kit configured for use in a processing chamber for processing a substrate having a given diameter includes a one-piece process kit shield, comprising: a cylindrical body having an upper portion and a lower portion; an adapter section extending radially outward from the upper portion and having a resting surface to support the one-piece process kit shield on walls of a chamber and a sealing surface on which a chamber lid rests to seal off an interior volume of the chamber when the one-piece process kit shield is placed in the chamber; an annular heat transfer channel disposed within the adapter section; and a cover ring section extending radially inward from the lower portion. A deposition ring is disposed beneath the cover ring section, wherein, when the one-piece process kit shield is disposed about a substrate, the cover ring section is configured to be spaced apart from the substrate by a predetermined distance, wherein a bottom surface of the cover ring section is configured to interface with an upper surface of the deposition ring, and wherein a tortuous path is formed between the bottom and upper surfaces.

In some embodiments, a process chamber includes: a chamber wall defining an inner volume within the process chamber; a sputtering target disposed in an upper section of the inner volume; a substrate support having a support surface to support a substrate having a given diameter below the sputtering target; and a process kit. The process kit includes: a one-piece process kit shield surrounding the sputtering target and the substrate support and a deposition ring. The one-piece process kit shield includes: a cylindrical body having an upper portion surrounding the sputtering target and a lower portion surrounding the substrate support; an annular heat transfer channel extending through the upper portion; and a cover ring section extending radially inward from the lower portion and surrounding the substrate support. The deposition ring is disposed beneath the cover ring section. The cover ring section includes a radially inwardly extending lip at least partially covering the deposition ring. The radially inwardly extending lip is configured to be spaced apart from the substrate by a predetermined distance. A bottom surface of the cover ring section is configured to interface with an upper surface of the deposition ring to form a tortuous path between the bottom and upper surfaces.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
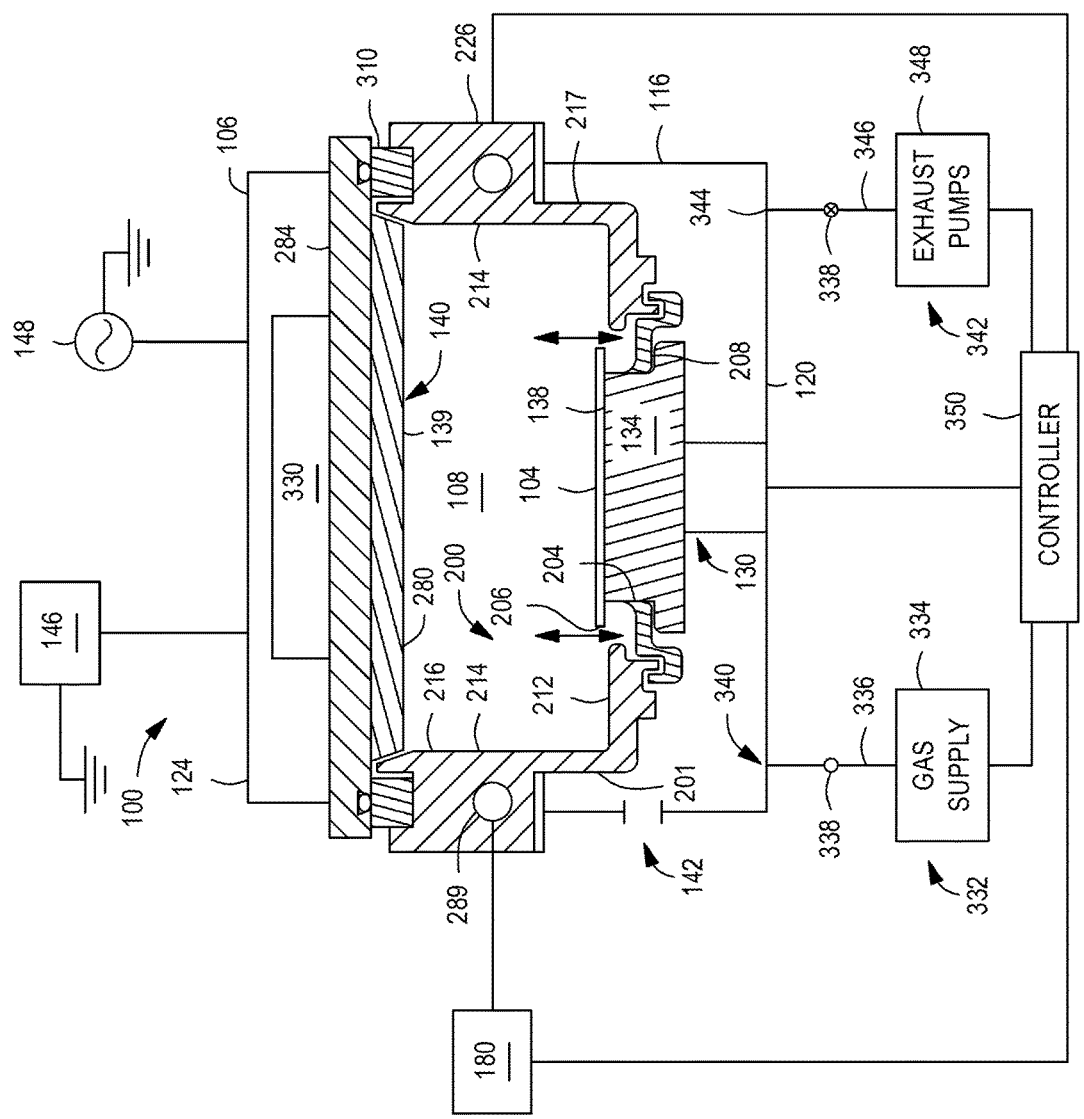
FIG. 1 depicts a schematic cross sectional view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of process kit shields and process chambers incorporating such process kit shields are provided herein.

In some embodiments, a cooled process kit shield is provided that advantageously improves the cooling efficiency and deposition uniformity on a substrate being processed. In some embodiments, a one-piece process kit shield including an adapter section and a cover ring section corresponding to an adapter and cover ring, respectively, are provided herein. The adapter section may include a heat transfer medium channel to cool the one-piece process kit shield. The one-piece process kit shield advantageously improves cooling of the shield and improved thermal conductivity between various portions of the shield, which were previously separate components. The one-piece shield also advantageously allows for plasma expansion towards the boundary to help reduce plasma non-uniformities associated with funnel/taper shaped shield designs.

FIG. 1 depicts a schematic, cross-sectional view of an illustrative process chamber 100 (e.g., a PVD chamber) having a process kit shield in accordance with some embodiments of the present disclosure. Examples of PVD chambers suitable for use with process kit shields of the present disclosure include the ALPS® Plus, SIP ENCORE®, and other PVD processing chambers commercially available from Applied Materials, Inc., of Santa Clara, Calif. Other processing chambers from Applied Materials, Inc. or other manufactures may also benefit from the inventive apparatus disclosed herein.

The process chamber 100 comprises chamber walls 106 that enclose an inner volume 108. The chamber walls 106 include sidewalls 116, a bottom wall 120, and a ceiling 124. The process chamber 100 can be a standalone chamber or a part of a multi-chamber platform (not shown) having a cluster of interconnected chambers connected by a substrate transfer mechanism that transfers substrates 104 between the various chambers. The process chamber 100 may be a PVD chamber capable of sputter depositing material onto a substrate 104. Non-limiting examples of suitable materials for sputter deposition include one or more of aluminum, copper, tantalum, tantalum nitride, titanium, titanium nitride, tungsten, tungsten nitride, and the like.

The process chamber 100 comprises a substrate support 130 which comprises a pedestal 134 to support the substrate 104. The pedestal 134 has a substrate support surface 138 having a plane substantially parallel to a sputtering surface 139 of a sputtering target 140. The substrate support surface 138 of the pedestal 134 receives and supports the substrate 104 during processing. The pedestal 134 may include an electrostatic chuck or a heater (such as an electrical resistance heater, heat exchanger, or other suitable heating device). In operation, a substrate 104 is introduced into the process chamber 100 through a substrate loading inlet 142 in the sidewall 116 of the process chamber 100 and placed onto the substrate support 130. The substrate support 130 can be lifted or lowered by a support lift mechanism and a lift finger assembly can be used to lift and lower the substrate 104 onto the substrate support 130 during placement of the substrate 104 on the substrate support 130 by a robot arm. The pedestal 134 can be maintained at an electrically floating potential or grounded during plasma operation.

Figure 2:
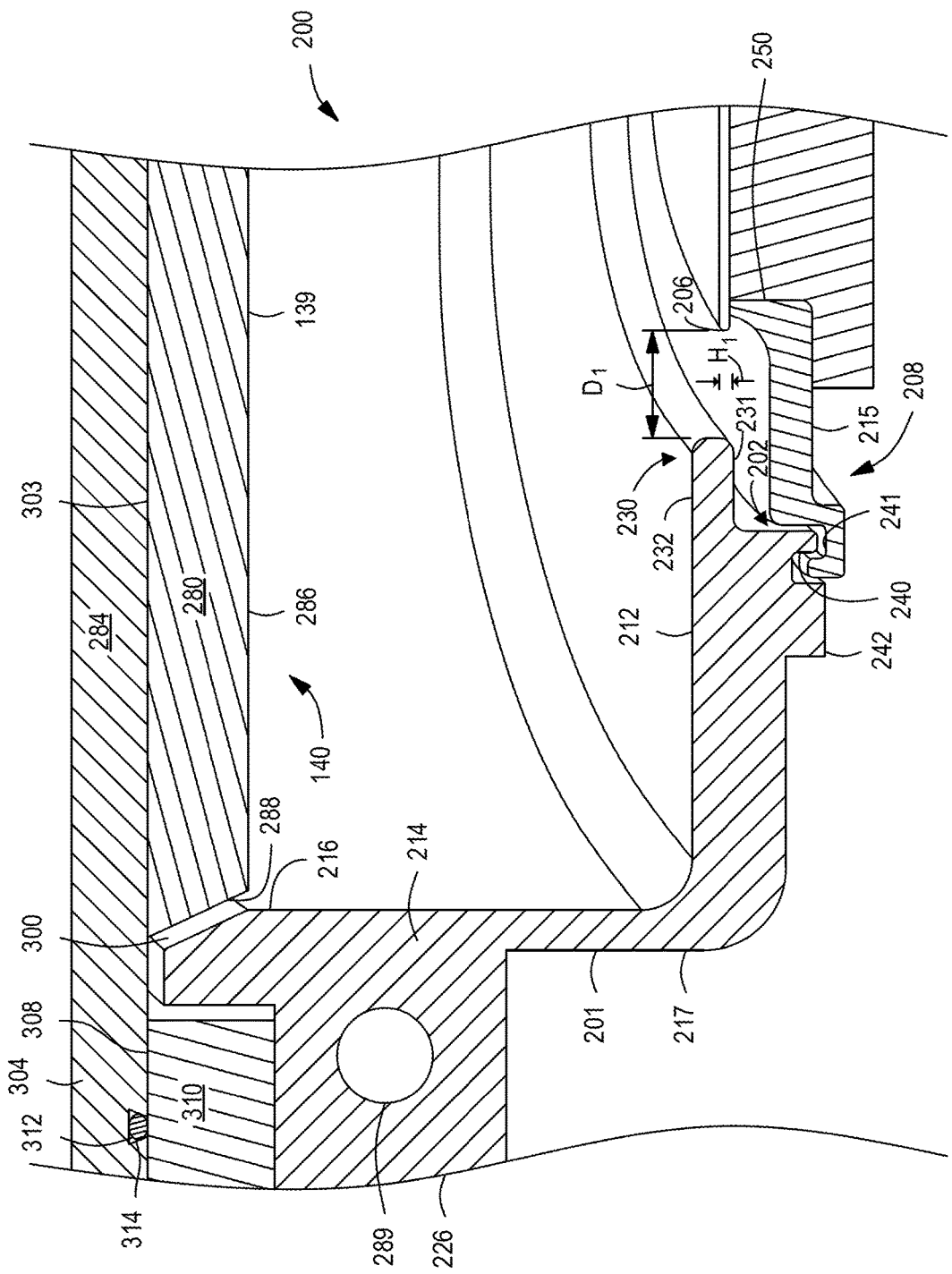
FIG. 2 depicts a schematic cross sectional view of a process kit shield in accordance with some embodiments of the present disclosure.
Figure 3:
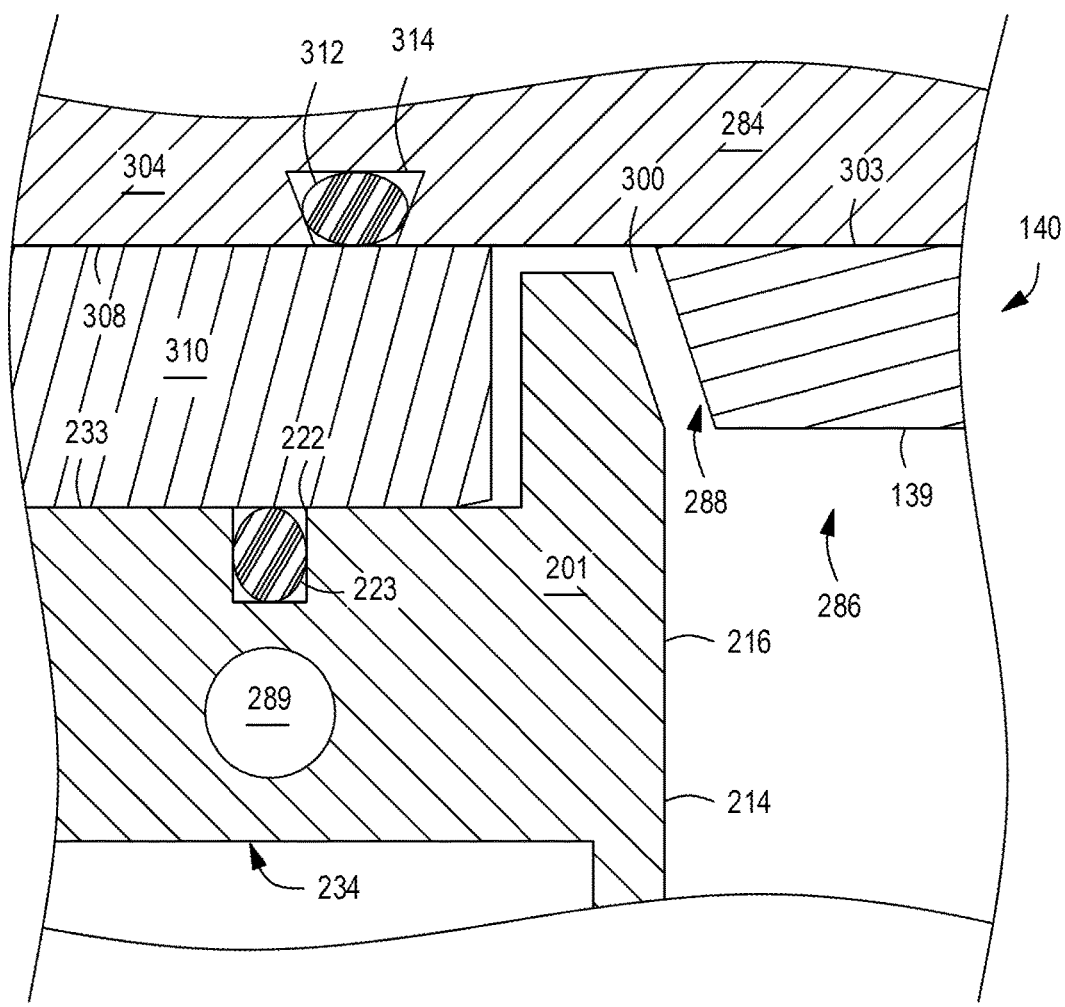
FIG. 3 depicts a schematic cross sectional view of an upper portion of a process kit shield in accordance with some embodiments of the present disclosure.

The process chamber 100 also contains a process kit 200, as shown in FIGS. 2 and 3, which comprises various components that can be easily removed from the process chamber 100, for example, to clean sputtering deposits off the component surfaces, replace or repair eroded components, or to adapt the process chamber 100 for other processes. The inventors have discovered that thermal resistances at contact interfaces a process kit shield, a process kit adapter, and a process kit cover ring adversely affect shield temperatures. Furthermore, low clamping forces between the shield and the adapter result in poor heat transfer between the adapter and the shield, even with coolant channels used to enhance heat transfer rates. The low heat transfer rate problem is further exacerbated with respect to the cover ring because the cover ring is a floating element (i.e., not coupled to the shield). Thus, the inventors have designed a process kit having a one-piece shield 201 that advantageously provides improved cooling/heating of the shield and the cover ring.

In some embodiments, the one-piece shield 201 includes a cylindrical body 214 having a diameter sized to encircle the sputtering surface 139 of the sputtering target 140 and the substrate support 130 (e.g., a diameter larger than the sputtering surface 139 and larger than the support surface of the substrate support 130). The cylindrical body 214 has an upper portion 216 that surrounds the outer edge of the sputtering surface 139 of the sputtering target 140 and a lower portion 217 that surrounds the substrate support 130. The upper portion 216 includes an adapter section 226 for supporting the one-piece shield 201 on the sidewall 116 and the lower portion 217 includes a cover ring section 212 for placement about a peripheral wall 204 of the substrate support 130. Conventional shield and cover ring designs result in plasma being funneled towards the substrate due to the tapered shape of the shield and cover ring. The inventors have discovered that configuring the upper portion 216 as a cylinder with vertical sidewalls and a cover ring section 212 that extends radially inward from and substantially perpendicular to the lower portion 217 allows for more uniform plasma distribution by allowing the plasma to expand and equilibrate in the inner volume 108.

The process kit 200 further comprises a deposition ring 208 disposed below the cover ring section 212. A bottom surface of the cover ring section 212 interfaces with the deposition ring 208 to form a tortuous path 202, as shown in FIG. 2. In some embodiments, the cover ring section 212 interfaces with but does not contact the deposition ring 208 such that the tortuous path 202 is a gap disposed between the cover ring section 212 and the deposition ring 208. For example, the bottom surface of the cover ring section 212 may include an annular leg 240 that extends into an annular trench 241 formed in the deposition ring 208. In some embodiments, the annular leg 240 may be an inner annular feature and the bottom surface of the cover ring section 212 may further include an outer downwardly extending annular feature 242 disposed radially outward and adjacent to the annular trench 241 and that extends below an upper surface of the deposition ring 208 adjacent to and radially outward of the annular trench 241. The tortuous path 202 advantageously limits or prevents plasma leakage to an area outside of the process kit 200.

The deposition ring 208 comprises an annular band 215 surrounding the substrate support 130. The cover ring section 212 includes a radially inwardly extending lip 230 that at least partially covers the deposition ring 208. The lip 230 includes a lower surface 231 and an upper surface 232. The deposition ring 208 and cover ring section 212 cooperate with one another to reduce formation of sputter deposits on the peripheral walls 204 of the substrate support 130 and an overhanging edge 206 of the substrate 104. The lip 230 of the cover ring section 212 is spaced apart from the overhanging edge 206 by a horizontal distance $D_1$ and a vertical distance $H_1$. In some embodiments, the horizontal distance $D_1$ may be between about 0.5 inches and about 1 inch to reduce a disruptive electrical field near the substrate 104 (i.e., an inner diameter of the lip 230 is greater than a given diameter of a substrate to be processed by about 1 inch to about 2 inches). In some embodiments, the substrate support 130 is lifted and lowered so that the vertical distance $H_1$ may be between about 0.11 inches below (i.e., about 0.11 inches between the upper surface 232 and a support-facing surface of the substrate) and about 0.2 inches above (i.e., about 0.2 inches between the lower surface 231 and a target-facing surface of the substrate) the substrate 104.

The one-piece shield 201 encircles the sputtering surface 139 of the sputtering target 140 that faces the substrate support 130 and the outer periphery of the substrate support 130. The one-piece shield 201 covers and shadows the sidewalls 116 of the process chamber 100 to reduce deposition of sputtering deposits originating from the sputtering surface 139 of the sputtering target 140 onto the components and surfaces behind the one-piece shield 201. For example, the one-piece shield 201 can protect the surfaces of the substrate support 130, overhanging edge 206 of the substrate 104, sidewalls 116 and bottom wall 120 of the process chamber 100.

As shown in FIGS. 1-3, the adapter section 226 extends radially outward from the upper portion 216 and the cover ring section extends radially inward from the lower portion 217 of the cylindrical body 214. The adapter section 226 includes a sealing surface 233 and a resting surface 234 opposite the sealing surface 233. The sealing surface 233 contains an O-ring groove 222 to receive an O-ring 223 to form a vacuum seal. The adapter section 226 comprises a resting surface 234 to rest upon the sidewalls 116 of the process chamber 100.

The adapter section 226 supports the one-piece shield 201 and can serve as a heat exchanger about a sidewall 116 of the substrate process chamber 100. In some embodiments, an annular heat transfer channel 289 is disposed in the upper portion 216 to flow a heat transfer medium. In some embodiments, the annular heat transfer channel 289 is disposed in the adapter section 226. Because the one-piece shield 201 is of unitary construction, the heat transfer medium flowing through the annular heat transfer channel 289 directly cools/heats the areas of the one-piece shield 201 corresponding to the shield and cover ring (i.e., the cylindrical body 214 and cover ring section 212, respectively). Furthermore, the unitary construction of the one-piece shield 201 advantageously allows for a direct coupling of a heat transfer medium supply 180 to the shield, which was previously indirectly coupled to a heat transfer supply via the adapter. The heat transfer medium supply 180 flows a heat transfer medium through the annular heat transfer channel 289 at a flowrate sufficient to maintain a desired shield temperature.

Returning to FIG. 2, the one-piece shield 201 allows better heat transfer from the one-piece shield 201 to and which reduces thermal expansion stresses on the material deposited on the shield. Portions of the one-piece shield 201 can become excessively heated by exposure to the plasma formed in the substrate processing chamber, resulting in thermal expansion of the shield and causing sputtering deposits formed on the shield to flake off from the shield and fall upon and contaminate the substrate 104. The unitary construction of the adapter section 226 and the cylindrical body 214 results in improved thermal conductivity between the adapter section 226 and the cylindrical body 214.

In some embodiments, the one-piece shield 201 comprises a unitary structure which is made from a monolith of material. For example, the one-piece shield 201 may be formed of stainless steel or aluminum. The unitary construction of the one-piece shield 201 is advantageous over conventional shields which include multiple components, often two or three separate pieces to make up the complete shield. For example, a single piece shield is more thermally uniform than a multiple-component shield, in both heating and cooling processes. For example, the one-piece shield 201 eliminates all thermal interfaces between cylindrical body 214, the adapter section 226, and the cover ring section 212 allowing for more control over the heat exchange between these sections. In some embodiments, the heat transfer medium supply 180 flows a coolant through the annular heat transfer channel 289 to combat the adverse effects of an overheated shield on the sputtered material deposited on the substrate 104, as explained above. In some embodiments, the heat transfer medium supply 180 flows a heated fluid through the annular heat transfer channel 289 to mitigate the difference between the coefficients of the thermal expansion of the sputtered material and the shield.

Furthermore, a shield with multiple components is more difficult and laborious to remove for cleaning. The one-piece shield 201 has a continuous surface exposed to the sputtering deposits without interfaces or corners that are more difficult to clean out. The one-piece shield 201 also more effectively shields the chamber walls 106 from sputter deposition during process cycles. In some embodiments, surfaces of the one-piece shield 201 exposed to the inner volume 108 in the process chamber 100 may be bead blasted to reduce particle shedding and prevent contamination within the process chamber 100.

The deposition ring 208 comprises an annular band 215 that extends about and surrounds the peripheral wall 204 of the substrate support 130 as shown in FIG. 2. The annular band 215 comprises an inner lip 250 which extends transversely from the annular band 215 and is substantially parallel to the peripheral wall 204 of the substrate support 130. The inner lip 250 terminates immediately below the overhanging edge 206 of the substrate 104. The inner lip 250 defines an inner perimeter of the deposition ring 208 which surrounds the periphery of the substrate 104 and substrate support 130 to protect regions of the substrate support 130 that are not covered by the substrate 104 during processing. For example, the inner lip 250 surrounds and at least partially covers the peripheral wall 204 of the substrate support 130 that would otherwise be exposed to the processing environment, to reduce or even entirely preclude deposition of sputtering deposits on the peripheral wall 204. Advantageously, the deposition ring 208 can be easily removed to clean sputtering deposits from the exposed surfaces of the deposition ring 208 so that the substrate support 130 does not have to be dismantled to be cleaned. The deposition ring 208 can also serve to protect the exposed side surfaces of the substrate support 130 to reduce their erosion by the energized plasma species.

The cover ring section 212 encircles and at least partially covers the deposition ring 208 to receive, and thus, shadow the deposition ring 208 from the bulk of the sputtering deposits. The constricted flow path of the tortuous path 202 restricts the build-up of low-energy sputter deposits on the mating surfaces of the deposition ring 208 and cover ring section 212, which would otherwise cause them to stick to one another or to the overhanging edge 206 of the substrate 104.

As shown in FIGS. 1-3, the sputtering target 140 comprises a sputtering plate 280 mounted to a backing plate 284. The sputtering plate 280 comprises a material to be sputtered onto the substrate 104. The sputtering plate 280 may have a central cylindrical mesa 286 having the sputtering surface 139 that forms a plane that is parallel to the plane of the substrate 104. An annular inclined rim 288 surrounds the cylindrical mesa 286. The upper portion 216 may include a beveled or inclined surface that matches the incline of the annular inclined rim 288.

The complex shape of the annular inclined rim 288 that is adjacent to the upper portion 216 of the one-piece shield 201 forms a convoluted gap 300 comprising a dark space region. The dark space region is an area which is highly depleted of free electrons and which can be modeled as a vacuum. Control of the dark space region advantageously prevents plasma entry into the dark space region, arcing, and plasma instability. The shape of the gap 300 acts as a labyrinth that impedes the passage of sputtered plasma species through the gap 300, and thus, reduces the accumulation of sputtered deposits on the surfaces of the peripheral target region.

The sputtering plate 280 comprises a metal or metal compound. For example, the sputtering plate 280 can be a metal, such as, for example aluminum, copper, tungsten, titanium, cobalt, nickel or tantalum. The sputtering plate 280 can also be a metal compound, such as for example, tantalum nitride, tungsten nitride or titanium nitride.

The backing plate 284 which has a support surface 303 to support the sputtering plate 280 and a peripheral ledge 304 that extends beyond the radius of the sputtering plate 280. The backing plate 284 is made from a metal, such as, for example, stainless steel, aluminum, copper-chromium or copper-zinc. The backing plate 284 can be made from a material having a thermal conductivity that is sufficiently high to dissipate the heat generated in the sputtering target 140, which is formed in both the sputtering plate 280 and the backing plate 284. The heat is generated from the eddy currents that arise in these plates 280, 284 and also from the bombardment of energetic ions from the plasma onto the sputtering surface 139 of the sputtering target 140. The higher thermal conductivity backing plate 284 allows dissipation of the heat generated in the sputtering target 140 to the surrounding structures or even to a heat exchanger which may be mounted behind the backing plate 284 or may be in the backing plate 284, itself. For example, the backing plate 284 can comprise channels (not shown) to circulate a heat transfer fluid therein. A suitably high thermal conductivity of the backing plate 284 is at least about 200 W/mK, for example, from about 220 to about 400 W/mK. Such a thermal conductivity level allows the sputtering target 140 to be operated for longer process time periods by dissipating the heat generated in the sputtering target 140 more efficiently.

In combination with a backing plate 284 made of a material having a high thermal conductivity and low resistivity, or separately and by itself, the backing plate 284 may comprises a backside surface having one or more grooves (not shown). For example, a backing plate 284 could have a groove, such as annular groove, or a ridge, for cooling the backside 141 of the sputtering target 140. The grooves and ridges can also have other patterns, for example, rectangular grid pattern, chicken feet patterns, or simply straight lines running across the backside surface.

In some embodiments, the sputtering plate 280 may be mounted on the backing plate 284 by diffusion bonding, by placing the two plates 280,284 on each other and heating the plates 280, 284 to a suitable temperature, typically at least about 200° C. Optionally, the sputtering target 140 may be a monolithic structure comprising a single piece of material having enough depth to serve as both the sputtering plate and backing plate.

The peripheral ledge 304 of the backing plate 284 comprises an outer footing 308 that rests on an isolator 310 in the process chamber 100 (FIGS. 2 and 3). The peripheral ledge 304 contains an O-ring groove 312 into which an O-ring 314 is placed to form a vacuum seal. The isolator 310 electrically isolates and separates the backing plate 284 from the process chamber 100, and is typically a ring formed of a dielectric or insulative material such as aluminum oxide. The peripheral ledge 304 is shaped to inhibit the flow or migration of sputtered material and plasma species through a gap between the sputtering target 140 and the isolator 310, to impede the penetration of low-angle sputtered deposits into the gap.

Returning to FIG. 1, the sputtering target 140 is connected to one or both of a DC power source 146 and an RF power source 148. The DC power source 149 can apply a bias voltage to the sputtering target 140 relative to the one-piece shield 201, which may be electrically floating during a sputtering process. While the DC power source 146 supplies power to the sputtering target 140, the one-piece shield 201, the substrate support 130, and other chamber components connected to the DC power source 146, the RF power source 148 energizes the sputtering gas to form a plasma of the sputtering gas. The plasma formed impinges upon and bombards the sputtering surface 139 of the sputtering target 140 to sputter material off the sputtering surface 139 onto the substrate 104. In some embodiments, RF energy supplied by the RF power source 118 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies.

In some embodiments, the process chamber 100 may include a magnetic field generator 330 to shape a magnetic field about the sputtering target 140 to improve sputtering of the sputtering target 140. The capacitively generated plasma may be enhanced by a magnetic field generator 330 in which for example, a permanent magnet or electromagnetic coils may provide a magnetic field in the process chamber 100 that has a rotating magnetic field having a rotational axis that is perpendicular to the plane of the substrate 104. The process chamber 100 may, in addition or alternatively, comprise a magnetic field generator 330 that generates a magnetic field near the sputtering target 140 of the process chamber 100 to increase an ion density in a high-density plasma region adjacent to the sputtering target 140 to improve the sputtering of the target material.

The sputtering gas is introduced into the process chamber 100 through a gas delivery system 332, which provides gas from a gas supply 334 via conduits 336 having gas flow control valves 338, such as a mass flow controllers, to pass a set flow rate of the gas therethrough. The gases are fed to a mixing manifold (not shown) in which the gases are mixed to from a desired process gas composition and fed to a gas distributor 340 having gas outlets to introduce the gas into the process chamber 100. The process gas may comprise a non-reactive gas, such as argon or xenon, which is capable of energetically impinging upon and sputtering material from the sputtering target 140. The process gas may also comprise a reactive gas, such as one or more of an oxygen-containing gas and a nitrogen-containing gas, that are capable of reacting with the sputtered material to form a layer on the substrate 104. The gas is then energized by the RF power source 148 to form a plasma to sputter the sputtering target 140. Spent process gas and byproducts are exhausted from the process chamber 100 through an exhaust 342. The exhaust 342 comprises an exhaust port 344 that receives spent process gas and passes the spent gas to an exhaust conduit 346 having a throttle valve to control the pressure of the gas in the process chamber 100. The exhaust conduit 346 is connected to one or more exhaust pumps 348.

Various components of the process chamber 100 may be controlled by a controller 350. The controller 350 comprises program code having instruction sets to operate the components to process a substrate 104. For example, the controller 350 can comprise program code that includes substrate positioning instruction sets to operate the substrate support 130 and substrate transfer mechanism; gas flow control instruction sets to operate gas flow control valves to set a flow of sputtering gas to the process chamber 100; gas pressure control instruction sets to operate the exhaust throttle valve to maintain a pressure in the process chamber 100; gas energizer control instruction sets to operate the RF power source 148 to set a gas energizing power level; temperature control instruction sets to control a temperature control system in the substrate support 130 or the heat transfer medium supply 180 to control a flowrate of the heat transfer medium to the annular heat transfer channel 289; and process monitoring instruction sets to monitor the process in the process chamber 100.

While the foregoing is directed to embodiments of the present disclosure, other and further embodiments of the disclosure may be devised without departing from the basic scope thereof.

The invention claimed is:

1. A one-piece process kit shield configured for use in a processing chamber for processing a substrate having a given diameter, comprising:
a cylindrical body having an upper portion and a lower portion;
an annular heat transfer channel disposed within the upper portion; and
a cover ring section extending radially inward from the lower portion and having an annular leg extending from a bottom surface of the cover ring section and a radially inwardly extending lip having an inner diameter greater than the given diameter by about 1 inch to about 2 inches, wherein the annular leg is configured to interface with a deposition ring to form a tortuous path between the bottom surface and the deposition ring.

2. The one-piece process kit shield of claim 1, wherein the upper portion comprises:
an adapter section extending radially outward and having a resting surface to support the one-piece process kit shield on walls of a chamber and a sealing surface on which a chamber lid rests to seal off an interior volume of the chamber when the one-piece process kit shield is placed in the chamber,
wherein the annular heat transfer channel is disposed in the adapter section.

3. The one-piece process kit shield of claim 1, wherein the cylindrical body extends vertically and the cover ring section is substantially perpendicular to the lower portion of the cylindrical body.

4. The one-piece process kit shield of claim 1, wherein the one-piece process kit shield is formed of aluminum.

5. The one-piece process kit shield of claim 1, wherein the one-piece process kit shield is formed of stainless steel.

6. A process kit configured for use in a processing chamber for processing a substrate having a given diameter, comprising:
a one-piece process kit shield, comprising:
a cylindrical body having an upper portion and a lower portion;
an adapter section extending radially outward from the upper portion and having a resting surface to support the one-piece process kit shield on walls of a chamber and a sealing surface on which a chamber lid rests to seal off an interior volume of the chamber when the one-piece process kit shield is placed in the chamber;
an annular heat transfer channel disposed within the adapter section; and
a cover ring section extending radially inward from the lower portion and having a radially inwardly extending lip having an inner diameter greater than the given diameter by about 1 inch to about 2 inches; and
a deposition ring disposed beneath the cover ring section,
wherein, when the one-piece process kit shield is disposed about a substrate, the cover ring section is configured to be spaced apart from the substrate by a predetermined distance, wherein a bottom surface of the cover ring section is configured to interface with an upper surface of the deposition ring, and wherein a tortuous path is formed between the bottom and upper surfaces.

7. The process kit of claim 6, wherein the bottom surface of the cover ring section includes an annular leg configured to extend into a corresponding annular trench in the deposition ring.

8. The process kit of claim 6, wherein the one-piece process kit shield is formed of aluminum.

9. The process kit of claim 6, wherein the cylindrical body extends vertically and the cover ring section is substantially perpendicular to the lower portion of the cylindrical body.

10. A process chamber, comprising:
a chamber wall defining an inner volume within the process chamber;
a sputtering target disposed in an upper section of the inner volume;
a substrate support having a support surface to support a substrate having a given diameter below the sputtering target; and
a process kit, comprising:
a one-piece process kit shield surrounding the sputtering target and the substrate support, comprising:
a cylindrical body having an upper portion surrounding the sputtering target and a lower portion surrounding the substrate support;
an annular heat transfer channel extending through the upper portion; and
a cover ring section extending radially inward from the lower portion and surrounding the substrate support; and
a deposition ring disposed beneath the cover ring section,
wherein the cover ring section includes a radially inwardly extending lip at least partially covering the deposition ring, wherein the radially inwardly extending lip is configured to be spaced apart from the substrate by a predetermined distance having a horizontal distance between the radially inwardly extending lip and an overhanging edge of the substrate between about 0.5 inches and about 1 inch, and wherein a bottom surface of the cover ring section is configured to interface with an upper surface of the deposition ring to form a tortuous path between the bottom and upper surfaces.

11. The process chamber of claim 10, wherein the upper portion comprises:
an adapter section extending radially outward and having a resting surface to support the one-piece process kit shield on the chamber wall and a sealing surface on which a chamber lid rests to seal off the inner volume, wherein the annular heat transfer channel is disposed in the adapter section.

12. The process chamber of claim 11, wherein the sealing surface includes an O-ring groove to receive an O-ring to form a vacuum seal between the adapter section and the chamber lid.

13. The process chamber of claim 11, wherein a first portion of the adapter section is disposed within the inner volume and a second portion of the adapter section is disposed outside of the inner volume.

14. The process chamber of claim 11, further comprising:
a heat transfer medium supply coupled to the annular heat transfer channel to supply a heat transfer medium to the annular heat transfer channel.

15. The process chamber of claim 10, wherein the predetermined distance further includes a vertical distance ranging from about 0.11 inches between an upper surface of the radially inwardly extending lip and a support-facing surface of the substrate to about 0.2 inches between a lower surface of the radially inwardly extending lip and a target-facing surface of the substrate.

16. The process chamber of claim 10, wherein a periphery of the sputtering target adjacent the upper portion is configured to form a convoluted gap having a dark space region.

17. The process chamber of claim 10, wherein the cylindrical body extends vertically and the cover ring section is substantially perpendicular to the lower portion of the cylindrical body.

18. The one-piece process kit shield of claim 1, wherein the cover ring section comprises:
an upper surface that is substantially planar;
a first radius between the upper surface and an innermost surface of the radially inward extending lip; and
a second radius between the innermost surface of the radially inward extending lip and a lower surface of the radially inwardly extending lip,
wherein the upper surface of the cover ring section and the lower surface of the radially inward extending lip are substantially parallel to each other.

19. The process kit of claim 6, wherein the cover ring section comprises:
an upper surface that is substantially planar;
a first radius between the upper surface and an innermost surface of the radially inward extending lip; and
a second radius between the innermost surface of the radially inward extending lip and a lower surface of the radially inwardly extending lip,
wherein the upper surface of the cover ring section and the lower surface of the radially inward extending lip are substantially parallel to each other.

20. The process chamber of claim 10, wherein the deposition ring includes an annular band that is substantially parallel to the radially inwardly extending lip.

* * * * *